(12) United States Patent
Onushkin et al.

(10) Patent No.: US 8,963,175 B2
(45) Date of Patent: Feb. 24, 2015

(54) LIGHT EMITTING DEVICE AND METHOD OF MANUFACTURING THE SAME

(75) Inventors: Grigory Onushkin, Gyunggi-do (KR);
Jin Hyun Lee, Gyunggi-do (KR);
Myong Soo Cho, Gyunggi-do (KR);
Pun Jae Choi, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 1039 days.

(21) Appl. No.: 12/266,300

(22) Filed: Nov. 6, 2008

(65) Prior Publication Data
US 2010/0109026 A1      May 6, 2010

(51) Int. Cl.
| | |
|---|---|
| *H01L 33/36* | (2010.01) |
| *H01L 27/15* | (2006.01) |
| *H01L 33/38* | (2010.01) |
| H01L 33/08 | (2010.01) |
| H01L 33/20 | (2010.01) |

(52) U.S. Cl.
CPC ............... *H01L 27/156* (2013.01); *H01L 33/08* (2013.01); *H01L 33/20* (2013.01); *H01L 33/385* (2013.01)
USPC .......................... 257/93; 257/99; 257/E33.012

(58) Field of Classification Search
CPC ....... H01L 33/02; H01L 33/20; H01L 33/385; H01L 33/387
USPC .......... 257/81, 93, 99, E33.012, E33.062, 91; 42/81, 93, 99, E33.012, E33.062
See application file for complete search history.

(56) References Cited

U.S. PATENT DOCUMENTS

| | | | |
|---|---|---|---|
| 6,472,688 B2 * | 10/2002 | Miyata | ............................ 257/79 |
| 6,547,249 B2 | 4/2003 | Collins, III et al. | |

(Continued)

FOREIGN PATENT DOCUMENTS

| | | |
|---|---|---|
| JP | 2007-157926 | 6/2007 |
| JP | 2007 157926 | 6/2007 |

(Continued)

OTHER PUBLICATIONS

Japanese Office Action, w/ English translation thereof, issued in Japanese Patent Application No. JP 2008-292646 dated Jun. 14, 2011.

(Continued)

*Primary Examiner* — Wael Fahmy
*Assistant Examiner* — Sarah Salerno
(74) *Attorney, Agent, or Firm* — McDermott Will & Emery LLP

(57) ABSTRACT

Provided are a light emitting device and a method of manufacturing the same. The light emitting device includes each of first and second semiconductor stacked structures including first and second conductive type semiconductor layers and an active layer, first and second contacts on tops and bottoms of the first and second semiconductor stacked structures to be connected to the first and second conductive type semiconductor layers, a substrate structure including first and second sides, a first insulation layer on an area where no second contact is formed among a surface of the first and second semiconductor stacked layers, first and second conductive layers connected to the second contacts of the first and second semiconductor stacked structures, first and second wiring layers on the first side of the substrate structure, and first and second external connection terminals connected to the first and second contacts of the first semiconductor stacked structure.

14 Claims, 8 Drawing Sheets

(56) References Cited

U.S. PATENT DOCUMENTS

| | | |
|---|---|---|
| 7,009,199 B2 | 3/2006 | Hall |
| 2004/0080941 A1 | 4/2004 | Jiang et al. |
| 2005/0167680 A1* | 8/2005 | Shei et al. .................. 257/79 |
| 2006/0022207 A1* | 2/2006 | Nishida et al. .............. 257/88 |
| 2006/0044864 A1 | 3/2006 | Lin et al. |
| 2006/0157718 A1* | 7/2006 | Seo et al. ................... 257/82 |
| 2008/0230789 A1* | 9/2008 | Onushkin et al. ........... 257/88 |

FOREIGN PATENT DOCUMENTS

| | | |
|---|---|---|
| JP | 2008 235883 A | 10/2008 |
| KR | 2006-0086593 A | 8/2006 |
| WO | WO 2007/111436 A1 | 10/2007 |

OTHER PUBLICATIONS

Japanese Office Action, and English Translation Thereof, Issued in Japanese Patent Application No. 2008-292646 Dated Nov. 29, 2011.

* cited by examiner

LIGHT EMITTING DEVICE AND METHOD OF MANUFACTURING THE SAME

BACKGROUND OF THE INVENTION

1. Field of the Invention

The present invention relates to a light emitting device and a method of manufacturing the same, and more particularly, to a light emitting device added with various functions through a wiring structure and an array of a semiconductor stacked structure for emitting light.

2. Description of the Related Art

A semiconductor light emitting diode has a beneficial advantage as a light source in an aspect of its output and efficiency or reliability, such that it has been actively under development as a high-output and high-efficiency light source that will replace a backlight of a lightening device or a display device.

In general, a semiconductor light emitting device is combined with a protection device such as a zener diode in order to prevent breakdown due to a voltage such as static electricity exceeding an allowable voltage. However, when the zener diode is additionally mounted, a required area is increased and a device structure becomes more complex.

Especially, these limitations become worse in an LED array having complex wiring connection, which can be driven through an AC voltage. In a complex structure where a plurality of devices is arrayed, complex wiring connections are required for AC driving. Therefore, mounting of an additional protection device is difficult and this difficulty serves as a main obstacle to realize miniaturization. Furthermore, it is difficult to acquire a position of a bonding pad requiring a predetermined area, which is used to be connected to an external circuit.

SUMMARY OF THE INVENTION

An aspect of the present invention provides a light emitting device with a new wiring connection structure where a protection device can be integrated and a method of manufacturing the same.

Another aspect of the present invention provides a light emitting device with a bonding pad structure useful for a complex wiring connection structure and a high integration and a method of manufacturing the same.

According to an aspect of the present invention, there is provided a light emitting device including: first and second semiconductor stacked structures, each including first and second conductive type semiconductor layers and an active layer disposed therebetween; first and second contacts formed on tops and bottoms of the first and second semiconductor stacked structures to be connected to the first and second conductive type semiconductor layers, respectively; a substrate structure including first and second sides disposed opposite to each other, wherein the first and second semiconductor stacked structures are buried in the substrate structure, and separated from each other to expose the first conductive type semiconductor layer through the first side; a first insulation layer formed on buried surfaces of the first and second semiconductor stacked structure, except for an area where the second contact is to be formed; first and second conductive layers connected to the second contacts of the first and second semiconductor stacked structures, respectively, and extending along the first insulation layer to have an exposed area at the first side of the substrate structure; first and second wiring layers formed on the first side of the substrate structure and connecting the exposed area of the conductive layer related to the first and second semiconductor stacked structures with the first contacts of the first and second semiconductor stacked structures; and first and second external connection terminals electrically connected to the first and second contacts of the first semiconductor stacked structure, respectively.

The substrate structure may be formed of a conductive material, and the light emitting device further may include a second insulation layer formed between the second semiconductor stacked structure and the substrate structure to allow the second contact of the second semiconductor stacked structure to be electrically insulated from the substrate structure. The substrate structure may be a metal layer formed through a plating process.

The substrate structure maybe formed of an electrically insulating material.

The first semiconductor stacked structure may have a larger occupation area on the substrate structure than the second semiconductor stacked structure.

The first semiconductor stacked structure may be in plurality, and the plurality of first semiconductor stacked structures may further include at least one wiring layer to be electrically connected to each other.

The at least one wiring layer may include a wiring layer connecting an exposed area of a specific first conductive layer with a first contact related to another specific first semiconductor stacked structure. The at least one wiring layer may include a wiring layer connecting an exposed area of a specific first conductive layer with an exposed area of another first conductive layer.

The light emitting device may further include a third insulation layer formed on an area of the first sides of the first and second semiconductor stacked structures, where the wiring layer is to be formed.

The plurality of semiconductor stacked structures may be electrically connected to each other through the additional wiring layer to allow a corresponding active layer to emit light at an alternating current (AC) voltage.

According to another aspect of the present invention, there is provided a method of manufacturing a light emitting device including: forming first and second semiconductor stacked structures on a substrate for growth, each of the first and second semiconductor stacked structures including first and second conductive type semiconductor layers and an active layer therebetween; forming a second contact on at least a portion of a top of the second conductive type semiconductor layer and forming a first insulation layer on a surface of the first and second semiconductor stacked structures, except for an area where the second contact is formed; forming first and second conductive layers to be connected to the second contacts of the first and second semiconductor stacked structures, respectively, and to extend toward a top of the substrate for growth along the first insulation layer; forming a substrate structure on the substrate for growth to surround the first and second semiconductor stacked structures; removing the substrate for growth from the first and second semiconductor stacked structures and the substrate structure to allow the extended area of the first and second conductive layers to be partially exposed; forming a first contact on an exposed surface of the first and second semiconductor stacked structures to be connected to the first conductive type semiconductor layer; forming first and second wiring layers on the exposed surface of the substrate structure to connect the exposed areas of the first and second conductive layers with the first contacts of the second and first semiconductor stacked structures, respectively; and forming first and second external connection terminals to be electrically connected to the first and second contacts of the first semiconductor stacked structure, respectively.

The forming of the second contact and the first insulation layer may include: forming the first insulation layer with an open area where the second contact is to be formed; and forming the second contact in the open area.

The first semiconductor stacked structure may have a larger occupation area on the substrate structure than the second semiconductor stacked structure.

The forming of the first and second semiconductor stacked structures may include: sequentially forming the first conductive type semiconductor layer, the active layer, and the second conductive type semiconductor layer on the substrate for growth; and performing mesa etching to allow the grown layers to be separated into the first and second semiconductor stacked structures.

The first insulation layer may extend to a top of an area between the first and second semiconductor stacked structures, and the method may further include removing the first insulation layer between the first and second semiconductor stacked structures after the separating of the first and second semiconductor stacked structures.

The mesa etching may be realized depending on its etching depth through two types of methods.

In one type, the mesa etching may be performed to allow a portion of the substrate for growth to be exposed in an area between the first and second semiconductor stacked structures. The forming of the first and second conductive layers may include forming a conductive layer, the conductive layer being connected to the second contact and extending to the remaining first conductive type semiconductor layer along sides of the first and second semiconductor stacked structures.

In another type, the mesa etching may be performed to allow at least a portion of the first conductive semiconductor structure to be partially exposed in an area between the first and second semiconductor stacked structures. In this case, the forming of the conductive layer may include forming a conductive layer that is connected to the second contact and extending to the remaining first conductive type semiconductor layer along sides of the first and second semiconductor stacked structures.

According to another aspect of the present invention, there is provided a light emitting device including: first and second semiconductor stacked structures, each including first and second conductive type semiconductor layers and an active layer disposed therebetween; first and second contacts formed on a top and bottom of the first semiconductor stacked structure to be respectively connected to the first and second conductive type semiconductor layers of the first semiconductor stacked structure; a substrate structure including first and second sides disposed opposite to each other, wherein the first and second semiconductor stacked structures are buried in the substrate structure, and separated from each other and disposed to expose the first conductive type semiconductor layer through the first side; an insulation layer formed on a surface of the first semiconductor stacked structure except for an area where the second contact is formed and on a surface of the second semiconductor stacked structure; a conductive layer connected to the second contact of the first semiconductor stacked structure and extending along the insulation layer to have an exposed area in the first side of the substrate structure; a wiring layer formed on the first side of the substrate structure, and extending from an exposed area of the conductive layer of the first semiconductor stacked structure above an exposed surface of the second semiconductor stacked structure; a first external connection terminal electrically connected to the first contact of the first semiconductor stacked structure; and a second external connection terminal formed on the wiring layer disposed on the exposed surface of the second semiconductor stacked structure.

According to another aspect of the present invention, there is provided a method of manufacturing a light emitting device including: forming first and second semiconductor stacked structures on a substrate for growth, the first and second semiconductor stacked structures including first and second conductive type semiconductor layers and an active layer therebetween; forming a second contact on at least a portion of a top of the second conductive type semiconductor layer and forming a first insulation layer on a surface, excepting for an area where the second contact is formed, of the first semiconductor stacked structure; forming a conductive layer to be connected to second contacts of the first semiconductor stacked structure, respectively, and to extend toward a top of the substrate for growth along the insulation layer; forming a substrate structure on the substrate for growth to surround the first and second semiconductor stacked structures; removing the substrate for growth from the first and second semiconductor stacked structures and the substrate structure to allow the extended area of the conductive layer to be partially exposed; forming a first contact on an exposed surface of the first and second semiconductor stacked structures to be connected to the first conductive type semiconductor layer; forming a wring layer on an exposed surface of the substrate structure to extend from an exposed area of the conductive layer to the exposed surface of the second semiconductor stacked structure; and forming a first external connection terminal to be electrically connected to the first contact of the first semiconductor stacked structure and forming a second external connection terminal on a wiring layer on the exposed surface of the second semiconductor stacked structure.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
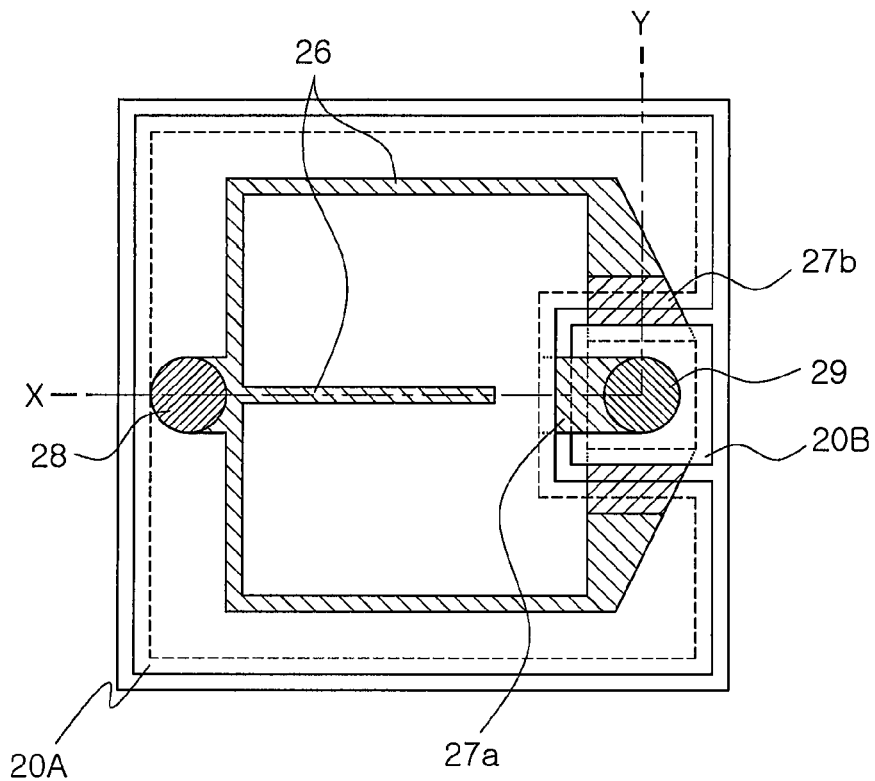
FIGS. 1(a) and 1(b) are a top plan view and a cross-section view, respectively, illustrating a zener diode integrated light emitting device according to an embodiment of the present invention.
Figure 1B:
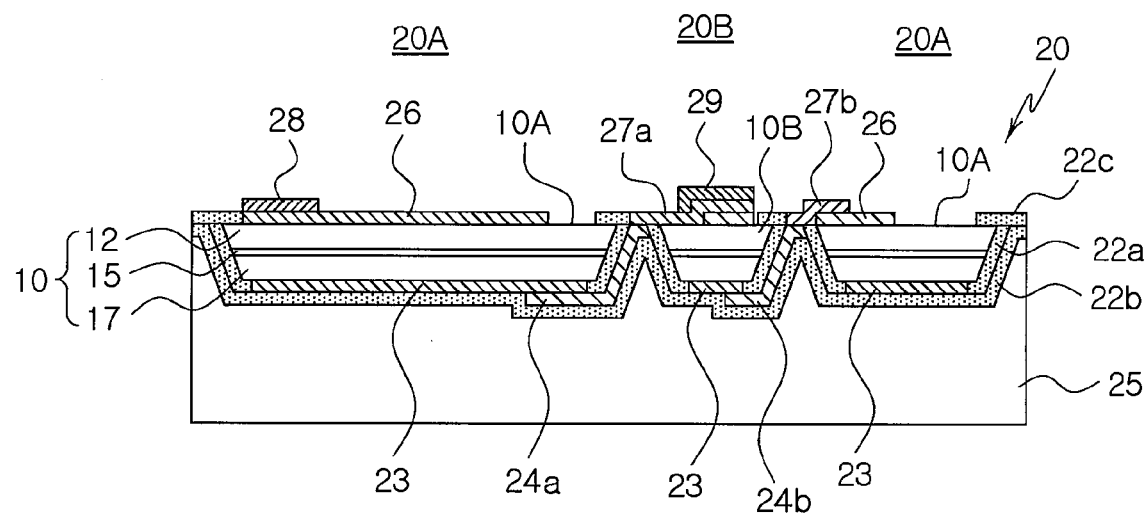

FIG. 1(a) is a top plan view illustrating one example (a planar structure) of a zener diode integrated light emitting device according to an embodiment of the present invention. FIG. 1(b) is a cross-sectional view taken along a line X-Y of the zener diode integrated light emitting device of FIG. 1(a).

As illustrated in FIGS. 1(a) and 1(b), a light emitting device 20 according to this embodiment includes a semiconductor stacked structure 10 and a substrate structure 25. The semiconductor stacked structure 10 includes an n-type semiconductor layer 12 and a p-type semiconductor layer 17, and an active layer 15 disposed therebetween. The substrate structure 25 surrounds the bottom and side of the semiconductor stacked structure 10. The semiconductor stacked structure 10 adopted in this embodiment may include AlGaInN or well-known various semiconductor materials such as AlGaAs, AlGaInP, and ZnO.

In this embodiment, the semiconductor stacked structure 10 includes first and second semiconductor stacked structures 10A and 10B. The first and second semiconductor stacked structures 10A and 10B may be the same semiconductor layer. The first semiconductor stacked structure 10A serves as a light emitting diode unit 20A and the second semiconductor stacked structure 10B serves as a zener diode unit 20B, through a wiring structure.

As illustrated in FIG. 1(a), in order to obtain a relatively large effective light emitting area, an area of the first semiconductor stacked structure 10A provided as the light emitting diode unit 20A may be designed larger than an area of the second semiconductor stacked structure 10B provided as the zener diode unit 20B.

First and second contacts 26 and 23 are formed on the tops and bottoms of the first and second semiconductor stacked structures 10A and 10B in order to contact the n-type and p-type semiconductor layers 12 and 17, respectively. As mentioned above, the first semiconductor stacked structure 10A serves as a light emitting diode. Since a light generated from the active layer 15 is emitted through the top (the n-type semiconductor layer 12) of the first semiconductor stacked structure 10A, the n-side contact may have an appropriate structure or use light transmittive electrode material in order to guarantee effective light emission and uniform current distribution. That is, like this embodiment, a structure providing a more uniform current distribution on an entire light emitting area can be provided through an electrode sheet.

A first insulation layer 22a is formed on the bottom portion where no second contact 23 is formed and the sides of the first and second semiconductor stacked structures 10A and 10B. This first insulation layer 22a may be a high resistance oxide or nitride such as $SiO_2$, $Si_3N_4$, AlN, and $Al_2O_3$.

The light emitting device 20 includes first and second conductive layers 24a and 24b in order to lead the p-side contacts of the first and second semiconductor stacked structures 10A and 10B to the top of the substrate structure 25, respectively. The first and second conductive layers 24a and 24b extend from the p-side contact 23 to the top, along the sides of the first and second semiconductor stacked structures 10A and 10B. Here, the first and second conductive layers 24a and 24b may be electrically insulated from the first and second semiconductor stacked structures 10A and 10B through the first insulation layer 22a.

In this embodiment, the substrate structure 25 may be formed of a conductive material. Because this conductive material typically has excellent heat conductivity, it may be used as the substrate of the light emitting device 10. The substrate structure 25 may be a metal layer, and may be formed through a plating process in order to obtain a sufficient thickness as a supporter.

Since the substrate structure 25 has electrical conductivity, a second insulation layer 22b may be additionally provided between the first and second semiconductor stacked structures 10A and 10B and the substrate structure 25. The p-side contacts 23 of the first and second semiconductor stacked structures 10A and 10B and the first and second conductive layers 24a and 24b can be electrically insulated from the substrate structure 25.

Unlike this embodiment, the substrate structure 25 may include an electrically insulating material. In this case, the second insulation layer 22b may not be required.

As mentioned above, the p-side contact 23 on the substrate structure 23 is led to the top of the substrate structure 25 through an electrode lead structure including the first and second conductive layer 24a and 24b and the first and second insulation layers 22a and 22b. Therefore, a wiring structure connecting the contacts of both polarities can be provided at the same surface.

In this embodiment, an appropriate wiring structure is formed on the substrate structure 25 in order to allow the first and second semiconductor stacked structures 10A and 10B to be driven as a light emitting diode and a zener diode, respectively. As illustrated in FIG. 1(b), the first wiring layer 27a connects the first conductive layer 24a with the n-side contact 26 of the second semiconductor stacked structure 10B. Moreover, the second wiring layer 27b connects the second conductive layer 24b with the n-side contact 26 of the first semiconductor stacked structure 10A. Therefore, the first and second semiconductor stacked structures 10A and 10B are connected to each other in a reverse polarity.

The light emitting device 20 includes first and second external connection terminals 28 and 29 that are electrically connected to the n-side and p-side contacts 26 and 23 of the first semiconductor stacked structure 10A, respectively. In this embodiment, the first and second external connection terminals 28 and 29 are formed on the n-side contacts 26 of the first and second semiconductor stacked structures 10A and 10B, respectively. The formation positions of the first and second external connection terminals 28 and 29 may vary if necessary.

FIGS. 2(a) to 2(f) are cross-sectional views illustrating manufacturing processes of the zener diode integrated light emitting device of FIGS. 1(a) and 1(b).

Figure 2A:
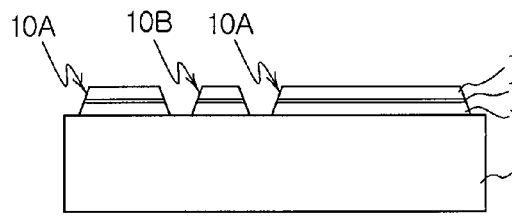
FIGS. 2(a) to 2(f) are cross-sectional views illustrating manufacturing processes of the zener diode integrated light emitting device of FIGS. 1(a) and 1(b)

First, as illustrated in FIG. 2(a), an n-type semiconductor layer 12, an active layer 15, and a p-type semiconductor layer 17 are sequentially formed on a substrate for growth 11 in order to form first and second semiconductor stacked structures 10A and 10B.

The first and second semiconductor stacked structures 10A and 10B can be obtained by applying mesa etching after sequentially growing the n-type semiconductor layer 12, the active layer 15, and the p-type semiconductor layer 17 on an entire top of the substrate for growth 11. The n-type and p-type semiconductor layers 12 and 17 and the active layer 15 may include AlGaInN or well-known various semiconductor materials such as AlGaAs, AlGaInP, and ZnO. In this embodiment, the mesa etching process is performed with a depth to expose the substrate for growth 11, such that the epitaxial layer is completely separated into the first and second semiconductor stacked structures 10A and 10B.

As described above, an area of the first semiconductor stacked structure 10A provided as the light emitting diode unit 20A may be designed larger than an area of the second semiconductor stacked structure 10B provided as the zener diode unit 20B (refer to FIG. 1(a)).

Figure 2B:
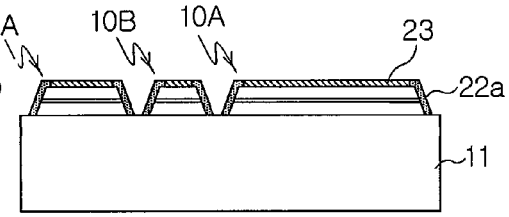

Next, as illustrated in FIG. 2(b), a p-side contact 23 contacting the p-type conductive type semiconductor layer 17 is formed on the first and second semiconductor stacked structures 10A and 10B, and a first insulation layer 22A is formed on the surface excepting for the p-side contact 23 of the first and second semiconductor stacked structures 10A and 10B.

This process is completed when selectively removing a preferred contact formation area and then forming the p-side contact 23 on the removed area after an insulator is deposited on an entire top of the substrate 11 where the first and second semiconductor stacked structures 10A and 10B are formed. The first insulation layer 22a may be a high resistance oxide or nitride such as $SiO_2$, $Si_3N_4$, AlN, and $Al_2O_3$.

In this embodiment, although it is illustrated that the insulator is removed from the contact formation area and around the first and second semiconductor stacked structures 10A and 10B, the first insulation layer 22a may extend to the top portion of the first and second semiconductor stacked structures 10A and 10B if necessary.

Figure 2C:
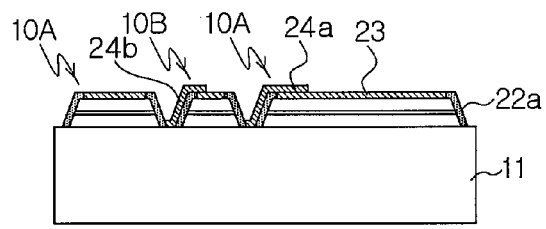

Next, as illustrated in FIG. 2(c), first and second conductive layers 24a and 24b are connected to the p-side contacts 23 and extend along the sides of the first and second semiconductor stacked structures 10A and 10B.

The first and second conductive layers 24a and 24b are provided as a lead structure for the p-side contacts 23 of the first and second semiconductor stacked structures 10A and 10B. In more detail, although the p-side contact 23 is on a substrate structure 25 in the next process, since the first and second conductive layers 24a and 24b connected to the p-side contacts 23 can have an exposed area at the surface where the substrate for growth 11 is removed, a wiring connection between the first and second semiconductor stacked structures 10A and 10B can be easily realized in the final structure.

Figure 2D:
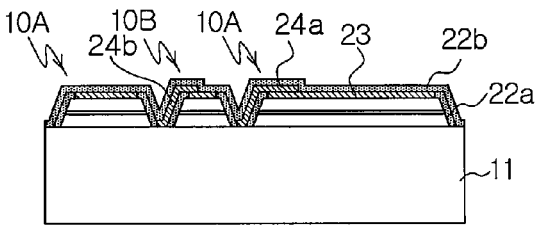

Next, as illustrated in FIG. 2(d), a second insulation layer 22b can be formed on the surface of the first and second semiconductor stacked structures 10A and 10B.

Figure 2E:
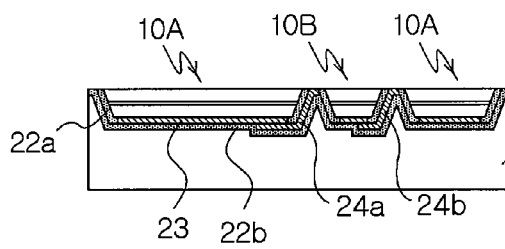

The second insulation layer 22b electrically insulates the substrate structure 25 of FIG. 2E that will be formed in the next process from the first and second conductive layers 24a and 24b. Accordingly, the second insulation layer 22b covers at least the first and second conductive layers 24a and 24b and the p-side contact 23. Like the first insulation layer 22a, the second insulation layer 22b may be a high resistance oxide or nitride such as $SiO_2$, $Si_3N_4$, AlN, and $Al_2O_3$.

Since this second insulation layer 22b is required when a conductive material is used for the substrate structure 25, if the substrate structure 25 is formed of an electrically insulating material, a process for forming the second insulation layer 22b can be omitted.

Next, as illustrated in FIG. 2(e), the substrate structure 25 is formed on the substrate for growth 11 to surround the first and second semiconductor stacked structures 10A and 10B. Then, the first and second semiconductor stacked structures 10A and 10B are separated from the substrate for growth 11.

In this embodiment, the substrate structure 25 can be obtained through a plating process after forming a seed layer (not shown) for the plating process on the second insulation layer 22b. The substrate structure 25 is formed of a metal material through the plating process in this embodiment, but is not limited thereto. As mentioned above, another insulation substrate can be provided instead of a conductive substrate such as a metal substrate.

After the forming of the substrate structure 25, the substrate for growth 11 is separated from the first and second semiconductor stacked structures 10A and 10B. This separation process can be completed through well-known processes such as mechanical or mechanical chemical polishing and chemical etching, but may be completed through a laser lift-off process.

Through this process, the first and second conductive layers 24a and 24b may have an exposed area at the surface where the substrate for growth 11 is removed. The exposed area of the first and second conductive layers 24a and 24b may be provided as an external connection structure for the p-side contact 23.

Figure 2F:
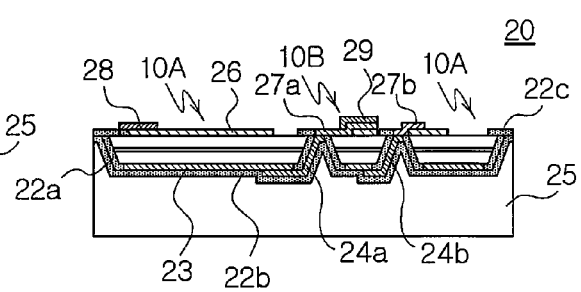

Next, as illustrated in FIG. 2(f), an n-side contact 26 is formed on the exposed surface of the first and second semiconductor stacked structures 10A and 10B to contact the n-type semiconductor layer 12 (refer to FIG. 1(b)), and first and second wiring layers 27a and 27b are formed to connect the exposed area of the first and second conductive layers 24a and 24b with the first contacts of the first and second semiconductor stacked structures 10A and 10B.

This process corresponds to a process for the surface exposed by the separation of the substrate for growth 11. The desired n-side contact 26 is formed on the first and second semiconductor stacked structures 10A and 10B to contact the n-type semiconductor layer 12. To allow the first and second semiconductor stacked structures 10A and 10B to serve as a light emitting diode unit and a zener diode unit, respectively, first and second wiring layers 27a and 27b are formed to connect the first and second semiconductor stacked structures 10A and 10B in a reverse polarity. That is, the first and second wiring layers 27a and 27b are formed to connect the exposed area of the first and second conductive layers 24a and 24b with the n-side contacts 26 of the first and second semiconductor stacked structures 10A and 10B.

If necessary, before forming the first and second wiring layers 27a and 26b like this embodiment, a process for forming a third insulation layer 22c on the first and second semiconductor stacked structures 10A and 10B can be additionally formed to prevent contacting an undesired area.

In the above-mentioned manufacturing process, an etching process for forming the first and second semiconductor stacked structures 10A and 10B is performed through deep-mesa etching, such that an epitaxial layer is completely separated to expose the substrate for growth 11. Unlike this, mesa etching for a light emitting stacked structure can be performed in order to leave a portion of an epitaxial layer.

In this case, the first and second conductive layers 24a and 24b are prevented from being damaged during the separation process such as laser lift off.

Unlike the above-mentioned embodiment, the light emitting device according to the present invention and the method of manufacturing the same may be modified for realization in various forms. For example, although the light emitting device has a parallel electrode structure in the above embodiment, it may have a vertical electrode structure in another embodiment.

On the other hand, mesa etching for obtaining a semiconductor stacked structure is completed through deep etching to expose the top of a substrate, for example, but shallow etching can be applied also. This embodiment can be explained with reference to another embodiment of FIGS. 3A and 3B.

Figure 3:
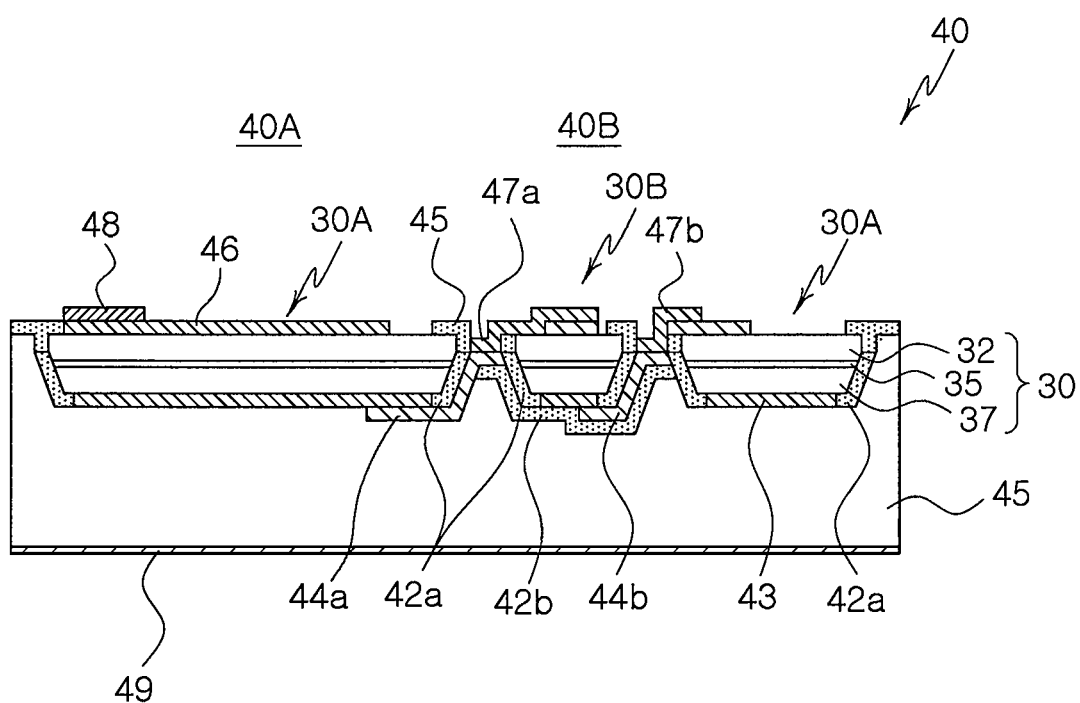
FIG. 3 is a cross-sectional view illustrating another embodiment (i.e., a vertical electrode structure) of a zener integrated light emitting device.

FIG. 3 is a cross-sectional view illustrating another embodiment (i.e., a vertical electrode structure) of a zener integrated light emitting device. Also, FIG. 3 is a cross-sectional view of a light emitting device having a structure similar to the plan view of FIG. 1(a).

As illustrated in FIG. 3, a light emitting device 40 of this embodiment includes a semiconductor stacked structure 30 having an n-type semiconductor layer 32 and a p-type semiconductor layer 37 and an active layer 35 disposed therebetween, and a substrate structure 45 surrounding the bottom and side of the semiconductor stacked structure 30. The semiconductor stacked structure 30 of this embodiment includes the first and second semiconductor stacked structures 30A and 30B like the previous embodiment. A semiconductor layer constituting the first and second semiconductor stacked structures 30A and 30B may be the same layer.

Through a wiring structure, the first semiconductor stacked structure 30A serves as a light emitting diode unit 40A and the second semiconductor stacked structure 30B serves as a zener diode unit 40B. To obtain a relatively large effective light emitting area, an area of the first semiconductor stacked structure 30A provided as the light emitting diode unit 40A may be designed larger than an area of the second semiconductor stacked structure 30B provided as the zener diode unit 40B.

On the top and bottom of the first and second semiconductor stacked structures 30A and 30B, n-side and p-side contacts 46 and 43 are formed to contact the n-type and p-type semiconductor layers 32 and 37, respectively. As mentioned above, the first semiconductor stacked structure 30A serves as the light emitting diode unit 40A. Since a light generated from the active layer 35 is emitted through the top (n-type semiconductor layer 32) of the first semiconductor stacked structure 30A, in order to guarantee effective light emission and uniform current distribution, the n-side contact 46 may have an appropriate structure or may use a light transmittive electrode material. That is, like this embodiment, a structure for guaranteeing more uniform current distribution in an entire light emitting area can be provided through an electrode sheet.

A first insulation layer 42a is formed on a bottom portion where the p-side contact 43 is not formed and the sides of the first and second semiconductor stacked structures 30A and 30B. This first insulation layer 42a may be a high resistance oxide or nitride such as $SiO_2$, $Si_3N_4$, AlN, and $Al_2O_3$.

The light emitting device 40 includes first and second conductive layers 44a and 44b in order to lead the p-side contacts 43 of the first and second semiconductor stacked structures 30A and 30B to the top of the substrate structure 45. The first and second conductive layers 44a and 44b extend to the top from the p-side contact 43 along the sides of the first and second semiconductor stacked structures 30A and 30B.

In the embodiment of FIG. 1(b), the first and second conductive layers 24a and 24b extend up to a height almost identical to the exposed surface of the first and second semiconductor stacked structures 10A and 10B. However, in this embodiment, the extended area of the first and second conductive layers 44a and 44b is lower than the exposed surface of the first and second semiconductor stacked structures 30A and 30B. This is because shallow etching is applied during mesa etching for forming the first and second semiconductor stacked structures 30A and 30B, and will be described with reference to FIGS. 4A to 4F.

In this embodiment, the substrate structure 45 may be formed of a conductive material. Since this conductive material typically has excellent heat conductivity, it may be used for a substrate of the light emitting device. The substrate structure 45 may be a metal layer, and may be formed through a plating process in order to easily obtain a thickness as a supporter. If the substrate structure 45 is formed of a conductive material, a light emitting device may have a vertical electrode structure like this embodiment.

To have the vertical electrode structure, the second insulation layer 42b is formed between the second semiconductor stacked structure 30B and the substrate structure 45. In more detail, through the second insulation layer 42b, the p-side contact 43 of the second semiconductor stacked structure 30B and the second conductive layer 44b are electrically insulated from the substrate structure 45, but the p-side contact 43 of the first semiconductor stacked structure 30A and the first conductive layer 44a may be electrically connected to the bottom of the conductive substrate structure 45.

Like this, the p-side contact 43 on the substrate structure 45 is led to the top of the substrate structure 45 through an electrode lead structure including the first and second conductive layers 44a and 44b and the first and second insulation layers 42a and 42b. Thus, a wiring structure for connecting the contacts of both polarities at the same surface can be provided.

In this embodiment, an appropriate structure is formed on the substrate structure 45 in order to allow the first and second semiconductor stacked structures 30A and 30B to be driven as a light emitting diode and a zener diode, respectively. As illustrated in FIG. 3, the first wiring layer 47a connects the first conductive layer 44a with the n-type contact 46 of the second semiconductor stacked structure 30B. Additionally, the second siring layer 47b connects the second conductive layer 44b with the n-type contact 46 of the first semiconductor stacked structure 30A. Therefore, the first and second semiconductor stacked structures 30A and 30B are connected to each other in a reverse polarity.

The light emitting device 40 includes first and second external connection terminals 48 and 49 that are formed to be electrically connected to the n-side and p-side contacts 46 and 43 of the first semiconductor stacked structure 30A, respectively. In this embodiment, the first and second external connection terminals 48 and 49 may be formed on the n-side contact 46 of the first semiconductor stacked structure 30A and the bottom of the substrate structure 45, respectively.

FIGS. 4(a) to 4(f) are cross-sectional views illustrating manufacturing processes of the zener diode integrated light emitting device of FIG. 3.

Figure 4A:
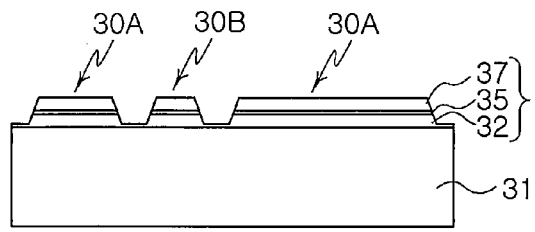
FIGS. 4(a) to 4(f) are cross-sectional views illustrating manufacturing processes of the zener diode integrated light emitting device of FIG. 3.

First, as illustrated in FIG. 4(a), an n-type semiconductor layer 32, an active layer 35, and a p-type semiconductor layer 37 are sequentially formed on a substrate for growth 31 in order to form first and second semiconductor stacked structures 30A and 30B.

Similar to the previous embodiment, this process can be completed by applying mesa etching after sequentially growing the n-type semiconductor layer 32, the active layer 35, and the p-type semiconductor layer 37 on an entire top surface of the substrate for growth 31. However, this embodiment leaves a semiconductor stacked structure (especially, an n-type semiconductor layer 32) having a predetermined thickness by applying shallow mesa etching. Accordingly, during this process, the first and second semiconductor stacked structures 30A and 30B are not completely separated but the remaining semiconductor layer may be easily removed through laser lift off or the next process.

Figure 4B:
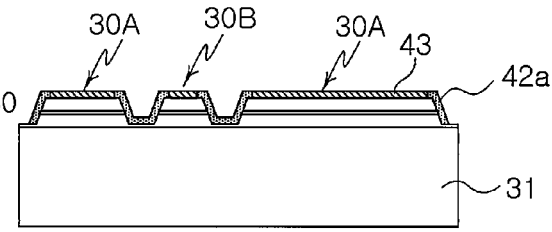

Next, as illustrated in FIG. 4(b), a p-side contact 43 contacting the p-type semiconductor layer 37 is formed on the top of first and second semiconductor stacked structures 30A and 30B, and a first insulation layer 42a is formed on the surface excepting for the p-side contact 43 of the first and second semiconductor stacked structures 30A and 30B.

This process can be completed by selectively removing a desired contact formation area and forming the p-side contact 43 on the removed area after depositing an insulator on an entire top of the substrate for growth 31 where the first and second semiconductor stacked structures 30A and 30B are formed. The first insulation layer 42a may be a high resistance oxide or nitride such as $SiO_2$, $Si_3N_4$, AlN, and $Al_2O_3$.

Figure 4C:
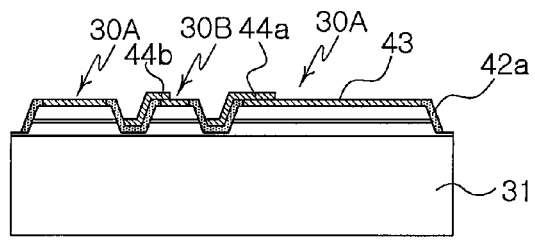

Next, as illustrated in FIG. 4(c), the first and second conductive layers 44a and 44b are formed to be connected to the p-side contact 43 and extend to the top of the substrate for growth 31 along the sides of the first and second semiconductor stacked structures 30A and 30B.

The first and second conductive layers 44a and 44b are provided as a lead structure for the p-sides of the first and second semiconductor stacked structures 30A and 30B. In more detail, even if the p-side contact 43 is on a substrate structure 45 that will be formed in the next process, the first and second conductive layers 44a and 44b connected to the p-side contact 43 may have an exposed area at the surface where the substrate for growth 31 is removed. Thus, a wiring connection between the first and second semiconductor stacked structures 30A and 30B can be easily realized in the final structure.

Figure 4D:
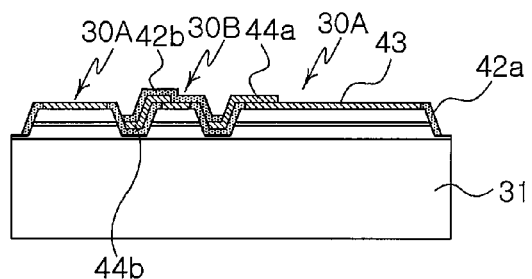

Next, as illustrated in FIG. 4(d), a second insulation layer 42b may be formed on the surface of the first and second semiconductor stacked structures 30A and 30B.

The second insulation layer 42b electrically insulates the substrate structure 45 from the second conductive layer 44b. Accordingly, the second insulation layer 42b is formed to cover the second conductive layer 44b and the p-side contact 43 of the second semiconductor stacked structure 30B. Similar to the first insulation layer 42a, the second insulation layer 42b may be a high resistance oxide or nitride such as $SiO_2$, $Si_3N_4$, AlN, and $Al_2O_3$.

Figure 4E:
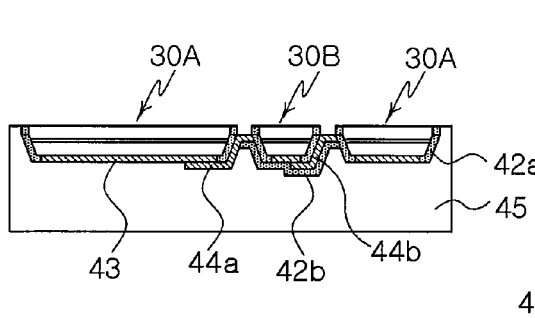

Next, as illustrated in FIG. 4(e), the conductive substrate structure 45 is formed on the substrate for growth 31 in order to surround the first and second semiconductor stacked structures 30A and 30B, and separates the first and second semiconductor stacked structures 30A and 30B from the substrate for growth 31.

After the forming of the conductive substrate structure 45, the substrate for growth 31 is separated from the first and second semiconductor stacked structures 10A and 10B. This separation process can be completed through well-known processes such as mechanical or mechanical chemical polishing and chemical etching, but may be completed through a laser lift-off process.

Especially, in this embodiment, during the separating of the substrate for growth 31 or an additional process thereafter, the remaining semiconductor layer is removed in order to completely separate the first and second semiconductor stacked structures 30A and 30B. The first and second conductive layers 44a and 44b are protected by the remaining epitaxial layer, damage due to mechanical chemical polishing or laser projection can be effectively prevented during this separation process.

Additionally, the remaining epitaxial layer and a portion of the first insulation layer 42a may be necessarily removed in order to expose a portion of the first and second conductive layers 441 and 44b. The remaining epitaxial layer may be voluntarily removed during the separation process through laser projection. If necessary, a portion of the first and second conductive layers 44a and 44b necessary for a wiring connection can be exposed through an additional etching process.

Accordingly, the first and second conductive layers 44a and 44b may have an exposed area lower than the surface where the substrate for growth 31 is removed. The exposed area of the first and second conductive layers 44a and 44b can be provided as an external connection structure for the p-side contact 43.

Figure 4F:
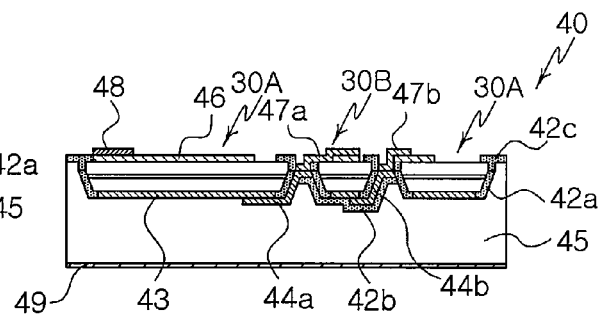

Next, as illustrated in FIG. 4(f), an n-side contact 46 is formed on the exposed area of the first and second semiconductor stacked structures 30A and 30B in order to contact the n-type semiconductor layer 32, and also first and second wiring layers 47a and 47b are formed to connect the exposed area of the first and second conductive layers 44a and 44b with the n-type contacts 46 of the first and second semiconductor stacked structures 30A and 30B.

This process corresponds to a process for the surface exposed by separating the substrate for growth 31. The desired n-side contact 46 is formed on the first and second semiconductor stacked structures 30A and 30B to contact the n-type semiconductor layer 32.

Next, in order to allow the first and second semiconductor stacked structures 30A and 30B to serve as a light emitting diode unit and a zener diode unit, respectively, first and second wiring layers 47a and 47b are formed to connect the first and second semiconductor stacked structures 30A and 30B in a reverse polarity. That is, the first and second wiring layers 47a and 47b are formed to connect the exposed area of the first and second conductive layer 44a and 44b with the n-side contact 46 of the first and second semiconductor stacked structures 30A and 30B.

If necessary, before the forming of the first and second wiring layers 47a and 46b like this embodiment, a process for forming a third insulation layer 42c on the first and second semiconductor stacked structures 30A and 30B can be additionally formed to prevent contacting an undesired area.

In this embodiment, the first external connection terminal 48 is formed on the first contact 46 of the first semiconductor stacked structure 30A, and the second external connection terminal 49 is formed on the bottom of the substrate structure 45. Thereby, a light emitting device having a desired vertical electrode structure can be realized. Here, the second external connection terminal 49 is electrically connected to the second contact 43 of the first semiconductor stacked structure 30A through the conductive substrate structure 45.

By applying a semiconductor stacked structure and a wiring structure similar to the above-mentioned embodiment, a bonding pad structure useful for a complex wiring connection structure and high integration can be provided. That is, a specific semiconductor stacked structure can be provided as a structure for a bonding pad according to another aspect of the present invention.

Figure 5:
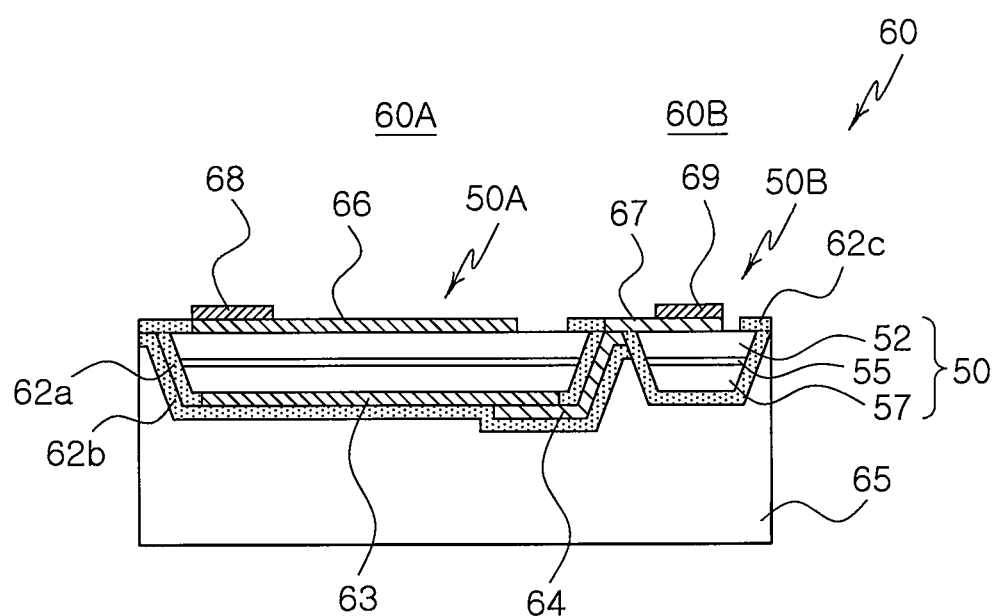
FIG. 5 is a cross-sectional view illustrating a light emitting device having a new bonding pad structure according to another embodiment of the present invention.

FIG. 5 is a cross-sectional view illustrating a light emitting device 60 having a new bonding pad structure according to another embodiment of the present invention.

As illustrated in FIG. 5, the light emitting device 60 according to this embodiment includes first and second semiconductor stacked structures 50A and 50B having first and second conductive type semiconductor layers 52 and 57, and an active layer 55 therebetween, and a substrate structure 65 surrounding the bottom and side of the first and second semiconductor stacked structures 50A and 50B, being similar to the previous embodiment. A semiconductor layer constituting the first and second semiconductor stacked structures 50A and 50B may be the same layer.

However, in this embodiment, the first semiconductor stacked layer 50A is provided as a light emitting diode unit, and the second semiconductor stacked structure 50B is provided as a bonding pad area. Accordingly, an area of the second semiconductor stacked structure 50B is provided being limited to an area for an external connection structure.

Additionally, an area of the first semiconductor stacked structure 50A is designed relatively larger in order to obtain a sufficient light emitting area.

First and second contact 66 and 63 are formed on the top and bottom of the first semiconductor stacked structure 50A in order to contact the first and second conductive type semiconductor layers 52 and 57. In order to expose the second contact 63, a first insulation layer 62a is formed on the sides and bottoms of the first and second semiconductor stacked structures 50A and 50B. This first insulation layer 62a may be a high resistance oxide or nitride such as $SiO_2$, $Si_3N_4$, AlN, and $Al_2O_3$.

Additionally, the light emitting device 60 includes a conductive layer 64 to lead the second contact 63 of the first semiconductor stacked structure 50A to the top of the substrate structure 65. The conductive layer 64 extends from the second contact 63 to the top along the side of the first semiconductor stacked structure 50A.

In this embodiment, the substrate structure 65 may be formed of a conductive material. Since this conductive material typically has excellent heat conductivity, it may be used for a substrate of the light emitting device 60. The substrate structure 65 may be a metal layer, and may be formed through a plating process in order to easily obtain a thickness as a supporter.

Since the substrate structure 65 has electrical conductivity, a second insulation layer 62b is additionally formed between the first and second semiconductor stacked structures 50A and 50B and the substrate structure 65. Through the second insulation layer 62b, the second contact 63 of the first semiconductor stacked structure 50A, the conductive layer 64, and the second semiconductor stacked structure 50B are electrically insulated from the substrate structure 65.

Unlike this, the substrate structure 65 may be formed of an electrically insulating material. In this case, the second insulation layer 62b is not required.

The second contact 63 on the substrate structure 65 is led to the top of the substrate structure 65 through an electrode lead structure including the conductive layer 64 and the first and second insulation layers 62a and 62b. Therefore, a wiring structure connecting the contacts of both polarities at the same surface can be provided. Here, the wiring layer 67 extends from the exposed area of the conductive layer 64 to the top of the second semiconductor stacked structure 50B. A first external connection terminal 68 is electrically connected to the first contact 66 of the first semiconductor stacked structure 50A. Moreover, a second external connection terminal 69 is formed on the wiring layer 67 disposed on the exposed surface of the semiconductor stacked structure 50B.

In this embodiment, the conductive layer 64 extends to a height almost identical to the exposed surface of the first and second semiconductor stacked structures 50A and 50B. However, as illustrated in FIGS. 3 and 4, the extended area of the conductive layer 64 is lower than the exposed surface of the first and second semiconductor stacked structures 50A and 50B according to kinds of mesa etching for separating them.

FIGS. 6(a) to 6(f) are cross-sectional views illustrating manufacturing processes of a light emitting device having the new bonding pad structure of FIG. 5.

Figure 6A:
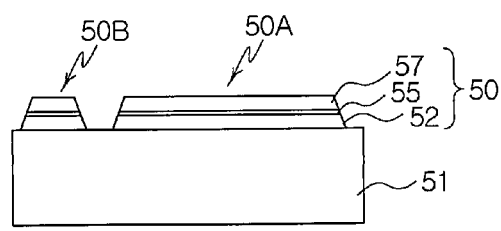
FIGS. 6(a) to 6(f) are cross-sectional views illustrating manufacturing processes of a light emitting device having the new bonding pad structure of FIG. 5.

First, as illustrated in FIG. 6(a), an n-type semiconductor layer 52, an active layer 55, and a p-type semiconductor layer 57 are sequentially formed on a substrate for growth 51 in order to form first and second semiconductor stacked structures 50A and 50B.

The first and second semiconductor stacked structures 50A and 50B can be obtained by applying mesa etching after sequentially growing the n-type semiconductor layer 52, the active layer 55, and the p-type semiconductor layer 57 on an entire top of the substrate for growth 51. The n-type and p-type semiconductor layers 52 and 57 and the active layer 55 may include AlGaInN or well-known various semiconductor materials such as AlGaAs, AlGaInP, and ZnO. In this embodiment, mesa etching is performed with a depth to expose the substrate for growth 51, such that an epitaxial layer is completely separated into the first and second semiconductor stacked structures 50A and 50B. Of course, the process can be completed through shallow mesa etching, as illustrated in FIG. 4A.

Figure 6B:
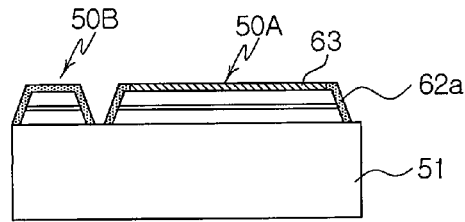

Next, as illustrated in FIG. 6(b), a p-side contact 63 contacting the p-type conductive type semiconductor layer 57 is formed on the first semiconductor stacked structures 50A, and a first insulation layer 62a is formed on the surface excepting for the p-side contact 63 of the first and second semiconductor stacked structures 50A and 50B.

This process is completed when selectively removing a preferred contact formation area and then forming the p-side contact 63 on the removed area after an insulator is deposited on an entire top of the substrate 51 where the first and second semiconductor stacked structures 50A and 50B are formed. The first insulation layer 62a may be a high resistance oxide or nitride such as $SiO_2$, $Si_3N_4$, AlN, and $Al_2O_3$.

In this embodiment, although it is illustrated that the insulator is removed from the contact formation area and around the first and second semiconductor stacked structures 50A and 50B, the first insulation layer 62a may extend to a top portion of the first and second semiconductor stacked structures 50A and 50B if necessary.

Figure 6C:
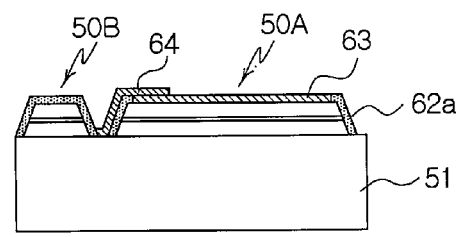

Next, as illustrated in FIG. 6(c), a conductive layer 64 is formed to be connected to the p-side contact 63 and extend to the top of the substrate for growth 51 along the sides of the first semiconductor stacked structure 50A.

The conductive layer 64 is provided as a lead structure for the p-side contact 63 of the first semiconductor stacked structure 60A. In more detail, the p-side contact 63 is on a substrate structure 65 during the next process, the conductive layer 64 connected to the p-side contact 63 may have an exposed area at the surface where the substrate for growth 51 is removed. Thus, a desired wiring connection can be easily realized.

Figure 6D:
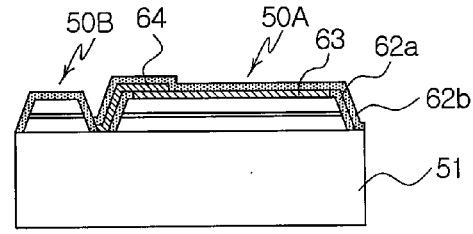

Next, as illustrated in FIG. 6(d), a second insulation layer 62B may be formed on the surface of the first and second semiconductor stacked structures 50A and 50B.

Figure 6E:
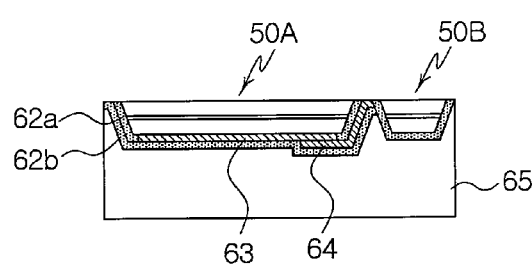
Figure 6F:
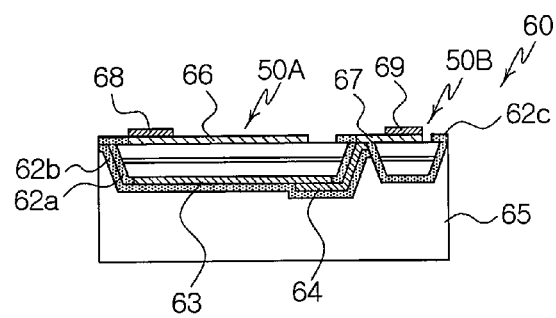

The second insulation layer 62b electrically insulates the substrate structure 65 of FIG. 6(e) that will be formed during the next process from the conductive layer 64. Accordingly, the second insulation layer 62b is formed to cover at least the second conductive layer 64 and the p-side contact 63. Like the first insulation layer 62a, the second insulation layer 62b may be a high resistance oxide or nitride such as $SiO_2$, $Si_3N_4$, AlN, and $Al_2O_3$.

Next, as illustrated in FIG. 6(e), the substrate structure 65 is formed on the substrate for growth 51 to surround the first and second semiconductor stacked structures 50A and 50B, and separates the first and second semiconductor stacked structures 50A and 50B from the substrate for growth 51.

In this embodiment, the substrate structure 65 can be obtained through a plating process after forming a seed layer (not shown) for the plating process on the second insulation layer 62b. The substrate structure 65 is formed of a metal material through the plating process in this embodiment, but is not limited thereto. As mentioned above, another insulation substrate can be provided instead of a conductive substrate such as a metal substrate.

After forming the substrate structure 65, the substrate for growth 51 is separated from the first and second semiconductor stacked structures 50A and 50B. This separation process can be completed through well-known processes such as mechanical or mechanical chemical polishing and chemical etching, but may be completed through a laser lift-off process.

Through this process, the conductive layer 64 may have an exposed area at the surface where the substrate for growth 51 is removed.

Next, as illustrated in FIG. 6(*f*), an n-side contact 66 is formed on the exposed surface of the first semiconductor stacked structure 50A to contact the n-type semiconductor layer 62, and a wiring layer 67 is formed to extend from the exposed area of the conductive layer 64 on the top of the second semiconductor stacked structure 50B.

The desired n-side contact 66 is formed on the first semiconductor layer 52 to contact the n-type semiconductor layer 52. Then, in order to allow the first semiconductor stacked structure 50A to serve as a light emitting diode unit, a first external connection terminal 68 is formed to be electrically connected to the first contact 66 of the first semiconductor stacked structure 50A, and a second external connection terminal 69 is formed on the wiring layer 67 at the exposed surface of the second semiconductor stacked structure 50B.

If necessary, like this embodiment, a process for forming a third insulation layer 62*c* is additionally performed on the first and second semiconductor stacked structures 50A and 50B in order to prevent contacting an unwanted area before the forming of the wiring layer 67.

In the light emitting device according to this embodiment, a sufficient area for an external connection, which is led from the contacts, can be provided. This external connection structure may be usefully applied to a bonding pad structure for external connection when a plurality of first semiconductor stacked structures is highly integrated.

A monolithic light emitting diode array suggested in the present invention provides an external connection structure connected to both contacts at the same surface having an almost flat form. Thus, a complex wiring connection between a plurality of LED cells can be easily realized. Especially, a monolithic light emitting device, which is connected to operate with an AC voltage, typically requires a complex wiring structure. In this case, the present invention may be usefully applied.

Figure 7A:
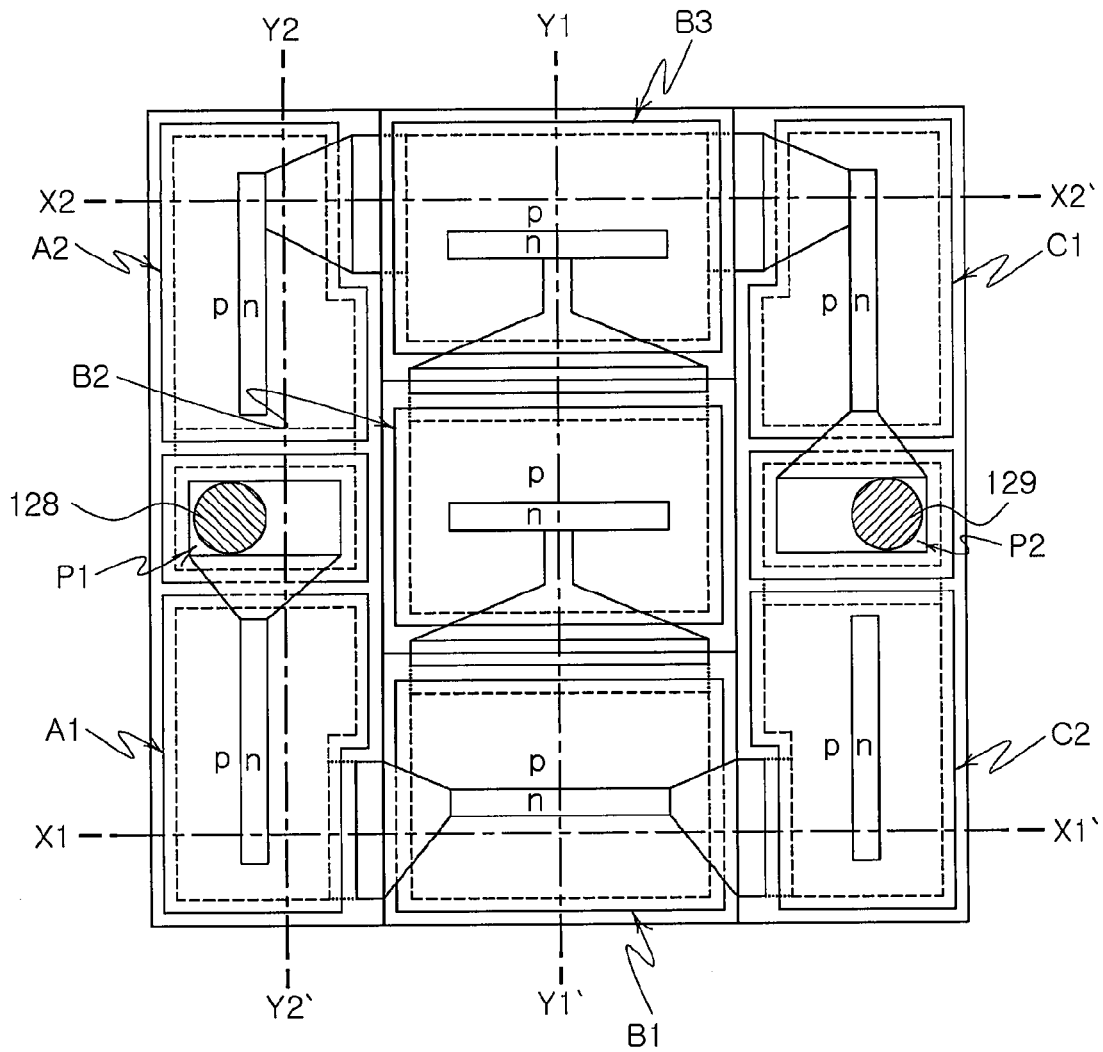
FIGS. 7(a) and 7(b) are a layout and an equivalent circuit of a monolithic light emitting diode array according to another embodiment of the present invention.
Figure 7B:
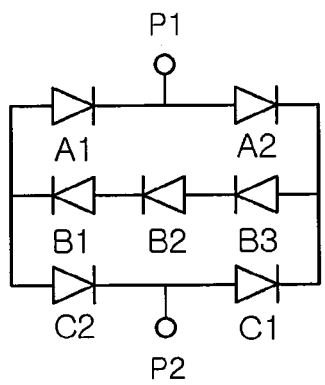

FIG. 7(*a*) is a layout of a monolithic light emitting diode array according to an embodiment of the present invention. FIG. 7(*b*) is an equivalent circuit of the monolithic light emitting diode array of FIG. 7(*a*).

The monolithic light emitting diode array of FIG. 7(*a*) includes first and second LED cells A1 and A2, third and fourth LED cells C1 and C2, and three fifth LED cells B1, B2, and B3 disposed therebetween. The third and fourth LED cells C1 and C2 are disposed facing the second and first LED cells A2 and A1, respectively.

A wiring structure of the monolithic light emitting diode array will be described with reference to FIG. 7(*b*).

An n-side contact of the first LED cell A1 and a p-side contact of the second LED cell A2 are connected to a first AC power source terminal P1. The p-side contact of the third LED cell C1 and the n-side contact of the fourth LED cell C2 are connected to a second AC power source terminal P2. The first and second AC power source terminals P1 and P2 are provided as an external connection terminal, and correspond to the second semiconductor stacked structure of FIG. 5. That is, a conductive layer extending from the n-side contact of the second LED cell A2 is led toward the semiconductor stacked structure of the first AC power source terminal P1. A wiring layer connected to the conductive layer extends on the semiconductor stacked structure of the first AC power source terminal P1. Moreover, similar to this, a conductive layer extending from the n-side contact of the fourth LED cell C2 is led toward the semiconductor stacked structure of the second AC power source terminal P2. A wiring layer connected to the conductive layer extends on the semiconductor stacked structure of the second AC power source terminal P2. This will be described in more detail with reference to FIG. 8.

The three fifth LED cells B1, B2, and B3 are connected in series. The n-side contact of the fifth LED cell B1 disposed at one side (i.e., between the first and fourth LED cells A1 and C2) forms a common contact point with respect to the p-side contact of the first and fourth LED cells A1 and C2. The p-side contact of the fifth LED cell B3 disposed at the other side (i.e., between the second and third LED cells A2 and C1) forms a common contact point with respect to the n-side contact of the second and third LED cells A2 and C1.

In the light emitting diode array based on this layout, each time an AC voltage is applied to the power source terminals P1 and P2, the three fifth LED cells B1, B2, and B3 are always driven. According to a period of an AC voltage, the first and third LED cells A1 and C1 and the second and fourth LED cells A2 and C2 can be alternately driven, and the three LED cells B1, B2, and B3 are continuously driven during the entire period. Consequently, driving of the five LED cells can be guaranteed.

Moreover, the layout of the monolithic light emitting diode array according to this embodiment has an advantageous point in an aspect of a breakdown voltage. Considering tolerance of a breakdown voltage, voltage applied to the LED cell may be designed to be almost similar to each other. Since this design allows each LED cell to have the almost same area, it can be effectively realized. For this, the number of the fifth LED cells can be appropriately adjusted. The desired number of the fifth LED cells ranges between 1 and 4.

Since the mentioned AC monolithic light emitting diode array has a complex wiring structure as illustrated in FIG. 7(*a*), it is difficult to realize a monolithic type. However, this wiring structure can be easily realized according to the present invention. In a structure where a plurality of LED cells is integrated, a necessary area for providing an external connection terminal connected to an AC power source can be guaranteed.

FIGS. 8(*a*) to 8(*d*) are cross-sectional views of the monolithic light emitting diode array of FIG. 7(*a*) taken along lines X1-X1', X2-X2', Y1-Y1', and Y2-Y2'. However, mesa etching, a lead structure, and wiring structure formation constituting the semiconductor stacked structure of this embodiment will be understood with reference to description of the above various embodiments.

Referring to FIGS. 8(*a*) to 8(*d*), a substrate structure 116 where three LED cells selected based on a sectional direction are disposed is illustrated. The LED cell includes a semiconductor stacked structure 110 and a substrate structure 116. The semiconductor stacked structure 110 includes n-type and p-type semiconductor layers 112 and 117, and an active layer 115 therebetween. The substrate structure 116 is formed to surround the bottom and side of the semiconductor stacked structure 110.

Although it may be partially shown according to a sectional direction, n-side and p-side contacts 126 and 123 contacting the n-type and p-type semiconductor layers 112 and 117, respectively, are formed on the top and bottom of the semiconductor stacked structure 110. A first insulation layer 122*a* is formed on the bottom portion where no p-side contact 123 is formed and the sides of the semiconductor stacked structure 110.

A conductive layer 124 is formed to be connected to the p-side contact 123 and extend along the side of the semiconductor stacked structure 11. The conductive layer 124 may be electrically insulated from the semiconductor stacked structure 111 through the first insulation layer 122a.

Figure 8A:
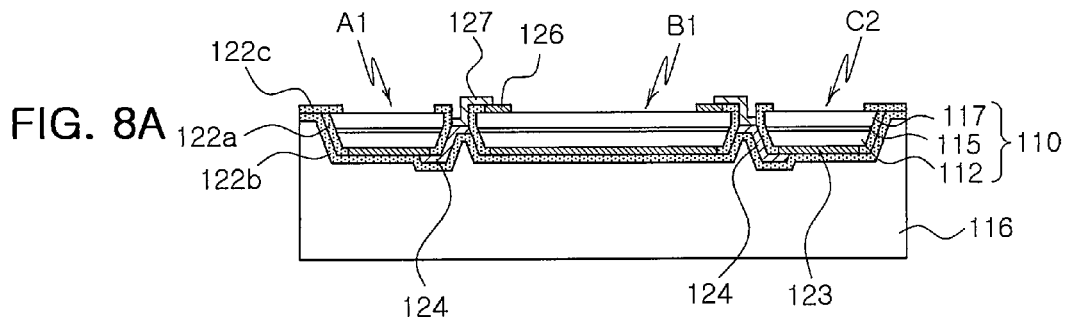
FIGS. 8(a) to 8(d) are cross-sectional views of the monolithic light emitting diode array of FIG. 7(a).

First, referring to FIG. 8(a), the conductive layer 124 provided to each LED cell A1 and C2 selects a side adjacent to a target (another LED cell and contact type) to which the p-side contact is to be connected, and then extends. In the structure of FIG. 7(a) (i.e., a cross-sectional view of X1-X1' of FIG. 7(a)), the conductive layer 124 of the first and fourth LED cells A1 and C2 may extend along the sides adjacent to the fifth LED cell B1.

The conductive layer 124 has an exposed area for a wiring connection at the position adjacent to the top of the semiconductor stacked structure 110. The exposed area of the conductive layer 124 of the first and fourth LED cells A1 and C2 is electrically connected to the n-side contacts 126 of the fifth LED cell B1 through a wiring layer 127. Therefore, the p-side contact 123 of the first and fourth LED cells A1 and C2 may have a common point with respect to the n-side contact 126 of the fifth LED cell B1 disposed therebetween.

Figure 8B:
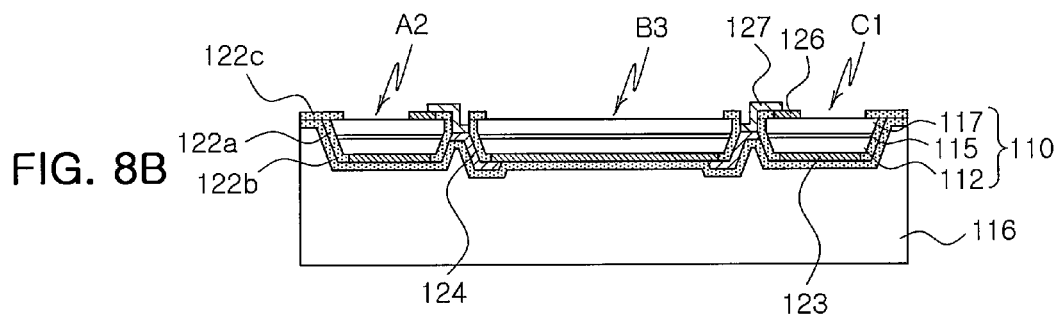

Referring to FIG. 8(b) (i.e., across-sectional view of X2-X2' of FIG. 7(a)), the conductive layer 124 of the fifth LED cell B3 between the second and third LED cells A2 and C1 extend in two directions along the side adjacent to the second and third LED cells A2 and C1, and has an exposed area for a wiring connection at the position adjacent to the top of the semiconductor stacked structure 110.

The exposed area of the conductive layer 124 of the fifth LED cell B3 is electrically connected to the n-side contact 126 of the second and third LED cells A2 and C1 through the wiring layer 127. Therefore, the n-side contacts 126 of the second and third LED cells A2 and C1 may have a common point with respect to the p-side contact 123 of the fifth LED cell B3 disposed therebetween.

Figure 8C:
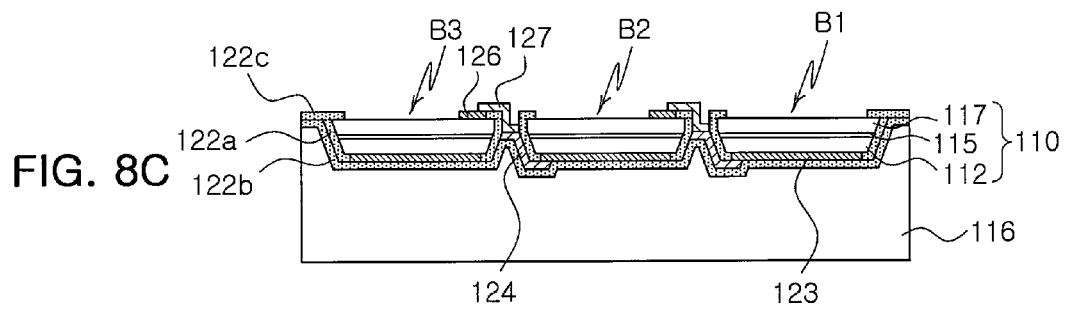

Referring to FIG. 8(c) (a cross-section view of Y1-Y1' FIG. 7(a)), a structure where the three fifth LED cells B1, B2, and B3 are disposed in parallel and are connected in series is illustrated. The conductive layer 124 of the fifth LED cells B1 and B2 extends to the side adjacent to the other fifth LED cells B2 and B3, and has an exposed area for a wiring connection at the position adjacent to the top of the semiconductor stacked structure 110.

The exposed area of the conductive layer 124 of the fifth LED cells B1 and B2 is electrically connected to the n-side contact 126 of the other fifth LED cells B2 and B3 through the wiring layer 127. Thereby, the three fifth LED cells B1, B2, and B3 are disposed in parallel and are connected in series.

Like this, a position of the conductive layer 124 to lead the p-side contact 123 of the substrate structure 116 and a desired connection between LED cells based on the wiring layer 127 can be easily achieved. Especially, although an additional description is made based on a sectional direction, since each corresponding component is formed through the same process, a monolithic light emitting diode array having a complex wiring structure can be effectively manufactured.

Although not illustrated in the above embodiments, according to a formation position of the wiring layer 127, a third insulation layer 122c can be additionally formed. The third insulation layer 122c prevents contacting external components such as the wiring layer 127, such that the semiconductor stacked structure 110 can be protected.

Figure 8D:
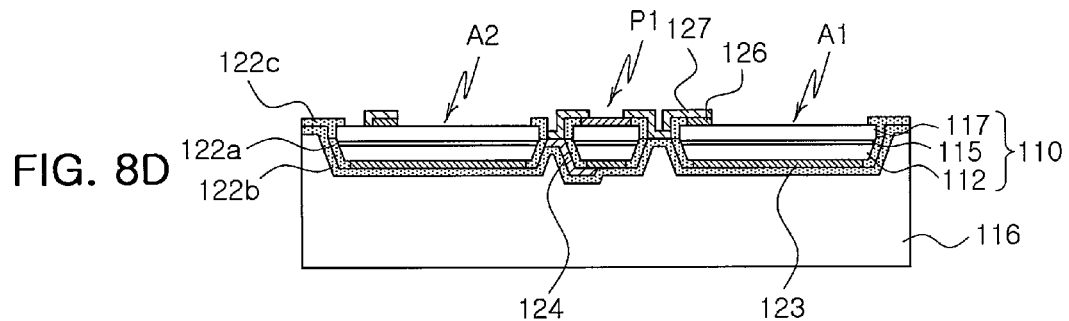

Referring to FIG. 8(d) (a cross-sectional view of Y2-Y2' of FIG. 1(a)), a structure where the first and second LED cells A1 and A2 and the first AC power source terminal P1 disposed therebetween are formed is illustrated. The conductive layer 124 of the second LED cell A2 is led toward the semiconductor stacked structure 110 of the first AC power source terminal P1, and extends to the top of the semiconductor stacked structure 110 of the first AC power source terminal P1 through the wiring structure. Moreover, the wiring layer 127 extends from the n-side contact 126 of the second LED cell A2 to the top of the semiconductor stacked structure 110 of the first AC power source terminal P1. Thereby, the semiconductor stacked structure 110 of the first AC power source terminal P1 may have an appropriate wiring connection structure, and provides a necessary area for an external connection terminal.

The monolithic light emitting diode array having a plurality of LED cells of FIGS. 7 and 8 may be similarly applied to a light emitting device structure for obtaining an area of an external connection terminal and also the zener diode integrated structure of FIGS. 1 to 4.

In this case, the first semiconductor stacked structure is in plurality, and the plurality of first semiconductor stacked structures may further include at least one wiring layer in order to electrically connect them through a method similar to the method of FIGS. 8A to 8C.

At least one wiring layer may be a layer that connects an exposed area of a conductive layer related to a specific first semiconductor stacked structure with a first contact related to another specific first semiconductor stacked structure. Unlike this, at least one wiring layer may be a layer that connects an exposed area of a conductive layer related to a specific first semiconductor stacked structure with an exposed area of a conductive layer related to another specific first semiconductor stacked structure. Furthermore, at least one wiring layer may be a combination layer of the above structures. Through the additional wiring layer, a plurality of first semiconductor stacked structures may be electrically connected to each other in order to allow a corresponding active layer to emit light at an AC voltage. Additionally, if necessary, a third insulation layer may be further formed on an area where the wiring layer is to be formed in first sides of the first and second semiconductor stacked structures.

As mentioned above, according to the present invention, since one side contact on a substrate structure is lead through a conductive layer, provided are a light emitting device having a new wiring connection structure where a protection device is integrated and a method of manufacturing the same. Additionally, provided are a light emitting device having a bonding pad structure that can be usefully provided for a complex wiring connection structure and a high degree of integration and a method of manufacturing the same. The structure based on the wiring connection may be usefully applied to an AC voltage driving LED array.

While the present invention has been shown and described in connection with the exemplary embodiments, it will be apparent to those skilled in the art that modifications and variations can be made without departing from the spirit and scope of the invention as defined by the appended claims.

What is claimed is:
1. A light emitting device, comprising:
a first semiconductor stacked structure serving as a light emitting diode and a second semiconductor stacked structure serving as a protection device, each comprising first and second conductive type semiconductor layers and an active layer disposed therebetween;
first contacts disposed on top surfaces of the first and second semiconductor stacked structures to be connected to the first conductive type semiconductor layers;
second contacts disposed on bottom surfaces of the first and second semiconductor stacked structures, opposite to the top surfaces thereof, to be connected to the second conductive type semiconductor layers;
a first external connection terminal disposed on the first contact that is disposed on the top surface of the first semiconductor stacked structure and electrically connected to the first contact disposed on the top surface of the first semiconductor stacked structure; and
a second external connection terminal disposed on the top surface of the second semiconductor stacked structure and electrically connected to the first contact disposed on the top surface of the second semiconductor stacked structure and to the second contact disposed on the bottom surface of the first semiconductor stacked structure;
wherein the first external connection terminal is disposed only on the first semiconductor stacked structure and the second external connection terminal is disposed only on the second semiconductor stacked structure.

2. The light emitting device of claim 1, wherein the second external connection terminal is disposed on a center of the top surface of the second semiconductor stacked structure such that the second semiconductor stacked structure surrounds the second external connection terminal.

3. The light emitting device of claim 1, wherein the second semiconductor stacked structure has a substantially square shape and the second external connection terminal has a circular shape.

4. The light emitting device of claim 1, wherein the second semiconductor stacked structure is disposed within an outline of the first semiconductor stacked structure.

5. The light emitting device of claim 1, wherein the second semiconductor stacked structure is disposed to surround a portion of side surfaces of the first semiconductor stacked structure and has a surface coplanar with a side surface of the first semiconductor stacked structure.

6. The light emitting device of claim 1, wherein the first and second semiconductor stacked structures have an overall square shape.

7. The light emitting device of claim 6, wherein the second semiconductor stacked structure is disposed in a middle of an edge of the square.

8. The light emitting device of claim 6, wherein the first and second external connection terminals are respectively disposed to be adjacent to edges of the square opposing to each other.

9. The light emitting device of claim 8, wherein the first and second external connection terminals are disposed in a linear manner.

10. The light emitting device of claim 1, wherein the first contact on the top surface of the first semiconductor stacked structure has a region corresponding to the first external connection terminal and extended regions extending from the region to the second external connection terminal.

11. The light emitting device of claim 10, wherein at least one of the extended regions crosses the top surface of the first semiconductor stacked structure.

12. A light emitting device, comprising:
a first semiconductor stacked structure serving as a light emitting diode and a second semiconductor stacked structure serving as a protection device, each comprising first and second conductive type semiconductor layers and an active layer disposed therebetween;
a first contact disposed on a top surface of the first semiconductor stacked structure and connected to the first conductive type semiconductor layer of the first semiconductor stacked structure;
a second contact disposed on a bottom surface of the first semiconductor stacked structure, opposite to the top surface thereof, and connected to the second conductive type semiconductor layer of the first semiconductor stacked structure;
a first external connection terminal disposed on the first contact; and
a second external connection terminal disposed on a top surface of the second semiconductor stacked structure and electrically connected to the second contact,
wherein the first external connection terminal is disposed only on the first semiconductor stacked structure and the second external connection terminal is disposed only on the second semiconductor stacked structure.

13. The light emitting device of claim 12, wherein the second external connection terminal is disposed on a center of the second semiconductor stacked structure.

14. A light emitting device, comprising:
first and second semiconductor stacked structures, each comprising first and second conductive type semiconductor layers and an active layer disposed therebetween, each of the first and second semiconductor stacked structures having first and second surfaces defined by the first and second conductive type semiconductor layers, respectively, and side surfaces disposed therebetween;
first contacts disposed on the first surfaces of the first and second semiconductor stacked structures to be connected to the first conductive type semiconductor layers of the first and second semiconductor stacked structures;
second contacts disposed on the second surfaces of the first and second semiconductor stacked structures to be connected to the second conductive type semiconductor layers of the first and second semiconductor stacked structures;
a substrate structure disposed to surround the side surface and the second surface of the first and second semiconductor stacked structures;
a first insulation layer disposed on the surrounded surfaces of the first and second semiconductor stacked structures, except for an area where the second contact is to be disposed;
first and second conductive layers connected to the second contacts of the first and second semiconductor stacked structures, respectively, and extending along the first insulation layer toward the first surfaces of the first and second semiconductor stacked structures, respectively;
first and second wiring layers disposed to connect the first and second conductive layers with the first contacts of the second and first semiconductor stacked structures, respectively;
first and second external connection terminals disposed on the first surfaces of the first and second semiconductor stacked structures to be electrically connected to the first and second contacts of the first semiconductor stacked structure, respectively; and
a second insulation layer disposed between the first and second semiconductor stacked structures and the substrate structure to allow the second contacts of the first and second semiconductor stacked structures to be electrically insulated from the substrate structure,
wherein the first and second semiconductor stacked structures are driven as a light emitting diode and a zener diode, respectively,
wherein the active layer of the second semiconductor stacked structure, and the first and second conductive type semiconductor layers of the second semiconductor stacked structure are respectively disposed at same levels as the active layer of the first semiconductor stacked structure, and the first and second conductive type semiconductor layers of the first semiconductor stacked structure, wherein the first semiconductor stacked structure has a larger occupation area on the substrate structure than the second semiconductor stacked structure, such that the first semiconductor stacked structure has a side surface coplanar with a side surface of the second semiconductor stacked structure, wherein the first external connection terminal is disposed on the first contact on the top surface of the first semiconductor stacked structure.

* * * * *

UNITED STATES PATENT AND TRADEMARK OFFICE
CERTIFICATE OF CORRECTION

PATENT NO. : 8,963,175 B2  
APPLICATION NO. : 12/266300  
DATED : February 24, 2015  
INVENTOR(S) : Grigory Onushkin et al.

Page 1 of 1

It is certified that error appears in the above-identified patent and that said Letters Patent is hereby corrected as shown below:

On the title page

Item (73) Assignee:

"Samsung Electro-Mechanics Co., Ltd."

should read

--Samsung Electronics Co., Ltd.--

Signed and Sealed this  
Ninth Day of August, 2016

Michelle K. Lee  
*Director of the United States Patent and Trademark Office*